United States Patent [19]

Knauer et al.

[11] Patent Number: 4,740,267
[45] Date of Patent: Apr. 26, 1988

[54] ENERGY INTENSIVE SURFACE REACTIONS USING A CLUSTER BEAM

[75] Inventors: Wolfgang Knauer, Malibu; John L. Bartelt, Camarillo, both of Calif.

[73] Assignee: Hughes Aircraft Company, Los Angeles, Calif.

[21] Appl. No.: 17,380

[22] Filed: Feb. 20, 1987

[51] Int. Cl.$^4$ .............. H01L 21/306; B44C 1/22; C23C 14/00; B05D 3/06

[52] U.S. Cl. .............. 156/635; 156/345; 156/643; 156/646; 156/657; 156/662; 204/192.23; 204/192.37; 427/38

[58] Field of Search .............. 156/345, 635, 643, 646, 156/654, 657, 662; 204/192.1, 192.11, 192.15, 192.22, 192.23, 192.32, 192.34, 192.35, 192.37, 298; 427/38, 93, 94, 248.1, 249, 250, 294; 250/492.1, 492.2, 492.3, 493.1

[56] References Cited

U.S. PATENT DOCUMENTS 4,411,733 10/1983 Macklin et al. .............. 156/643
4,457,803 7/1984 Takigawa .............. 156/662 X
4,540,466 9/1985 Nishizawa .............. 156/345 X
4,541,890 9/1985 Cuomo et al. .............. 156/345
4,559,096 12/1985 Fridman et al. .............. 204/192.34 X Primary Examiner—William A. Powell
Attorney, Agent, or Firm—W. Denson-Low; A. W. Karambelas

[57] ABSTRACT

Chemical reactions are accomplished at a surface of a substrate by supplying both a chemical reactant and energy by means of a cluster beam of a volatile material. Discrete units containing a volatile reactant are formed into clusters, ionized, accelerated to high energy, and impacted against the surface. The clusters disintegrate, and the reactant species reacts at the surface, under the influence of the energy transferred by the accelerated cluster. The clustered species may be the only reactant, as in a decomposition reaction, or additional reactants may be supplied from the surface or from other external sources, as in a film deposition, etching reaction, or catalysis reaction.

18 Claims, 3 Drawing Sheets

ENERGY INTENSIVE SURFACE REACTIONS USING A CLUSTER BEAM

The U.S. Government has rights in this application pursuant to Contract No. N00014-85-C-0523, which was awarded by the Department of the Navy.

BACKGROUND OF THE INVENTION

This invention relates to energy intensive chemical reactions at surfaces, and, more particularly, to accomplishing chemical reactions at surfaces when both a reactant and energy are externally supplied to accomplish the reaction.

Various types of chemical reactions occur or are produced at surfaces. In some reactions, such as most catalysis reactions and the deposition of a reaction product film wherein the reactants are supplied from an external source, the surface provides a site for the reaction to occur but does not itself provide a chemical reactant. In others, such as the etching of a surface or the growth of a film of a reaction product formed by a reaction involving the atoms or molecules at the surface, the surface itself enters into the reaction by supplying a reactant.

Many surface reactions are, or could be, of great commercial significance. Catalysis reactions are widely used to produce chemical products. The chemical etching of films, a chemical process wherein a portion of the film is reacted and removed, is a central feature of microelectronic fabrication technology. Reactive deposition of films onto a surface, as in chemical vapor deposition, permits production of special types of films for electronic and optical applications that cannot be produced otherwise.

Many of the reactions that occur at surfaces require the input of energy to overcome a reaction energy barrier. Most chemical reactions are accelerated when the reactants are energized, and faster chemical reactions improve the economics of using the surface reactions. The most common approach to providing energy is to heat the surface through the underlying substrate, thereby energizing the reactants at the surface. When applied in the context of deposition of a film of a reaction product, this approach has the drawback of also heating the previously deposited layers. This heating of the prior layers can cause an undesirable interdiffusion of the layers, where different layers have been deposited on top of each other.

Another approach to providing energy to the reaction occurring at the surface is to direct energy at the surface, as with a laser beam or ultraviolet light. This approach has been successful in some applications, but requires that the incident beam be properly tuned and directed to couple its energy to that of the reactants. It is desirable to make the directed beam as intense as possible to transfer a high energy level, but intensity is limited by the transfer of heat to the surface. Some of the heat can be removed by cooling the substrate, but unintended heating and even melting of the surface layers is a limitation on the power that can be introduced into the surface reaction. Another approach to energizing the surface is to create a plasma at the surface, but the field of the plasma often limits the ability to bring further reactants to the surface, is difficult to control as to the amount of energy input, and may have undesirable side effects on the surface.

Thus, while the use of surface reactions is well established and widely used commercially, and the need to provide energy to at least some types of reactions is recognized, there continue to be difficulties in introducing both reactants and energy to the surface as the reaction proceeds. There is a need for a technique for providing both reactants and energy to the surface, in a controllable manner. The present invention fulfills this need, and further provides related advantages.

SUMMARY OF THE INVENTION

The present invention resides in a technique for introducing reactants and energy to a surface reaction simultaneously, in a well controlled manner. The energy is applied directly and in a controllable manner to the externally introduced reactant species prior to its introduction to the surface. The addition of the reactive species is not limited by space charge adjacent the surface. The process is highly versatile, and can be used in such varied types of surface reactions as etching, film deposition, and catalytic reactions. The substrate surface is not damaged by the energetic introduction of the reactant. The process also continuously cleans the surface of impurities and reduces or eliminates surface imperfections.

In accordance with the invention, a process for accomplishing externally energized chemical reactions at a surface comprises the steps of forming clusters of units of a volatile reactive species containing from 2 to about 10,000 units; accelerating the clusters toward the surface; and impacting the clusters upon the surface, so that the clusters disintegrate and provide a reactant and energy to the chemical reaction at the surface.

As used herein, a cluster is a weakly bound assembly of structural units, typically formed by condensation with homogeneous or heterogeneous nucleation of the cluster. The "units" can be atoms, molecules, or complexes that individually exist independently of the cluster, but are formed into a cluster for the reasons to be discussed subsequently. The cluster is weakly ionized, as by electron bombardment, so that the cluster is ionized, preferably singly ionized or at most with a few ionic charges. That is, each individual unit of the cluster is not ionized, but perhaps only one or a few electrons are removed from the entire cluster. The cluster is accelerated toward the substrate by an accelerating potential, based upon the reaction of an electric field with the ionized cluster. Because of the high cluster mass, typically 1000 times that of a single unit, the resulting cluster beam is not dispersed by its own space charge.

When the cluster impacts upon the surface of the substrate target, it immediately disintegrates into the individual units comprising the cluster. Each unit has a small energy, equal to the total energy of the cluster divided by the number of units in the cluster, so that little damage is done to the surface and few defects are introduced. The units of the cluster have sufficient energy to dislodge contaminants on the surface, thereby cleaning the surface simultaneously with deposition. The units produced by the disintegration of the cluster also have sufficient energy to energize other reactants or species on the surface to move or react. Where a film is being deposited, the movement of reactant and nonreactant species increases the uniformity of the deposited film with much the same result as if the surface were heated to a much higher temperature than necessary with the present process. The previously deposited layers are not heated, however, so that the structure already deposited and buried inside the structure is not disturbed.

The reactant supplied by the units forming the clusters may be of various types, as required by the reaction at the surface. For example, the reaction at the surface may be the etching of the surface, and the etchant reactive species is provided in the units of the cluster. In accordance with this embodiment, a process for etching a surface comprises the steps of forming clusters of units of a volatile reactive etchant species, each cluster containing from 2 to about 10,000 units of the reactant species; ionizing the clusters; accelerating the clusters toward the surface; and impacting the clusters upon the surface, so that the clusters disintegrate and provide the etchant species and energy to the etching reaction at the surface.

One preferred type of etchant, for use with semiconductor material that must be etched generally or in selected patterns, is molecules containing halogens that either dissociate to free the halogens or become chemically reactive in the energized surface environment. Such units include $CCl_4$, $CF_4$, and $NF_3$. The units are formed into clusters, and the clusters are ionized and accelerated against the surface, which is typically a semiconductor such as silicon. Upon impact, the energized units dissociate to produce free halogens, which react with the surface atoms. The reaction product is volatile, and the etched material leaves the surface as a gaseous chloride or fluoride. The cluster beam can be directed generally against the surface to achieve general etch cleaning, or can be directed in a controlled pattern to selectively etch corresponding patterns into the surface.

In another application of the invention, films of reaction products can be deposited upon a surface. These films can constitute a single, stable reacted layer produced by the reaction between the reactants of the clusters and the substrate. For example, if a silicon nitride layer were to be produced at the surface of a silicon substrate, a volatile reactive nitrogen-containing unit can be formed into clusters and directed against the surface. In such a case, the film will thicken until diffusional kinetics essentially stops the supply of the substrate material reactant, and there will be no further growth. The films can also constitute a reaction product that are produced in an arbitrarily thick layer, as where all of the reaction products are externally supplied to the surface, and at least some are supplied by energized clusters. As an example, a tungsten film of arbitrary thickness can be grown by directing clusters of a tungsten containing compound such as $W(CO)_6$ against the surface. Energized decomposition of the clusters at the surface deposits tungsten, and the volatile carbon monoxide species escapes from the surface. In yet another form of the invention, another reactant species could be provided externally of the surface, so that the cluster reactant species and the other reactant species would reactant in the energized state at the surface. An example is the co-deposition of $AsH_3$ clusters and tetramethylgallium at a surface, to form a gallium arsenide film at the surface, with the volatile hydrogen and methyl species leaving the surface after being freed.

In accordance with this approach, a process for producing a reacted film upon a surface comprises the steps of forming clusters containing units of a volatile reactant species to be deposited in a film, each cluster containing from 2 to about 10,000 units of the species; ionizing the clusters; accelerating the clusters toward the surface; and impacting the clusters upon the surface, so that the clusters disintegrate and provide the reactant species and energy to the deposition reaction at the surface, the film that is produced being the result of a chemical reaction involving the species provided in the clusters. The reaction may involve a single reactant supplied by the clusters. The reaction may also involve multiple species, supplied by the surface itself or by another external source.

In yet another variation of the invention, two or more types of clusters can be directed against the surface, each supplying a reactant species. This approach is particularly useful where high energetic levels are required for the reaction to proceed, since each reactant unit carries with it a high energy level. In accordance with this embodiment, a process for accomplishing externally energized chemical reactions at a surface comprises the steps of forming first clusters containing from 2 to about 10,000 units of a volatile reactant species; ionizing the first clusters; accelerating the first clusters toward the surface; impacting the first clusters upon the surface, so that the first clusters disintegrate and provide the first reactant and energy to the chemical reaction at the surface; forming second clusters containing from 2 to about 10,000 units, each unit containing a second reactant species; ionizing the second clusters; accelerating the second clusters toward the surface; and impacting the second clusters upon the surface, so that the second clusters disintegrate and provide the second reactant and energy to the chemical reaction at the surface. Typically, the first and second types of clusters are supplied to the surface essentially simultaneously, or in a periodic sequence, in the proper ratios to produce the desired stoichiometry of the intended chemical reaction. Even where one or both of the cluster sources are pulsed, the energized species on the surfaces are typically resident for a sufficiently long time that the reaction can occur, and in this sense the sources are operated simultaneously.

It has been known previously to deposit reacted films by directing clusters of a nonvolatile material against a surface simultaneously with a nonclustered reactive gas. The present approach of forming clusters of units of a volatile reactive species has major technical and commercial advantages as compared to such an approach. (As used herein and in the art, a "volatile" material forms a gas at ambient or low elevated temperature, while a "nonvolatile" material is solid at ambient or low elevated temperature and must be heated to a high temperature to produce a partial pressure of its vapor.) The cluster forming efficiency for nonvolatile materials is small, on the order of a few percent, with only $10^{12}$ to $10^{13}$ clusters formed per second in a typically sized apparatus. The cluster forming efficiency for volatile materials is much higher, often over 75 percent, with $10^{15}$ to $10^{16}$ clusters formed per second in a comparable apparatus. The present approach therefore provides a cluster flux many times higher than where nonvolatile cluster materials are used. Large scale commercial operations are therefore possible when volatile clusters are used.

It will be recognized that the approach of the present invention provides an important advance in the art of surface chemical reactions, by supplying both a reactant and energy in a cluster form to the surface. Additional important benefits are the cleaning of the surface and the driving force for uniform, highly perfect, and highly dense films, where film deposition is the objectives of

DETAILED DESCRIPTION OF THE PREFERRED EMBODIMENTS

Figure 1:
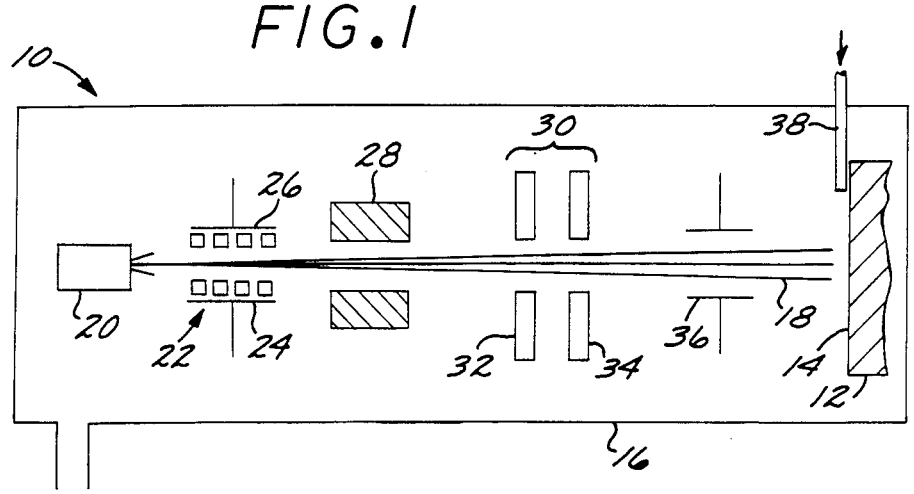
FIG. 1 is a schematic illustration of a cluster beam deposition apparatus for producing a single cluster beam.

The process of the present invention is performed in an apparatus for creating and depositing cluster upon a substrate, one form of which is illustrated as the deposition apparatus 10 of FIG. 1. A substrate 12 having a surface 14 is mounted in a vacuum chamber 16 so that a cluster beam 18 may be directed against the surface 14.

The clusters are initially produced in a supersonic nozzle source 20. The presently preferred type of source 20 for producing clusters is illustrated in outline in FIG. 1, and will be discussed in more detail in respect to FIG. 3. It will be understood that various types of nozzle sources may be used, depending upon the nature of the reactive species in the clusters.

The material that makes up the clusters is provided as "structural units" or "units". These terms, as used herein, can refer to atoms, simple molecules, complex molecules, or complexes, which include the reactive species. The units are formed into clusters in the vapor source 20.

Clusters emitted by the source 20 are generally well collimated and carry no electrical charge. The clusters enter an ionizer 22, wherein many clusters are positively ionized by electron bombardment, so that the clusters can then be accelerated toward the substrate 12. In the preferred ionizer 22, electrons are emitted from a cathode 24 toward an anode 26 under a positive potential of from about 50 to about 100 volts, and with a current of about 10 to about 30 milliamps. The path of the electrons is transverse to and intercepting the line of flight of the previously unionized cluster beam 18. Some of the electrons hit some of the particles, and the particles become positively charged. It is therefore convenient to consider the cluster itself to be positively charged, and to continue to speak of units, rather than ions, comprising the cluster. The low level of ionization is required so that the clusters may be controllably accelerated toward the substrate 12.

The ionized clusters in the cluster beam 18 enter a mass separator 28, which removes unclustered atoms and ions, and clusters of sizes significantly larger or smaller than a desired size. It is preferred that most of the mass reaching the surface 14 exceed a minimum size, or number of units within each cluster. Otherwise, after disintegration of the clusters upon striking the surface 14, the units containing the reactive species and coming from smaller clusters will have excessive energies. An excessive energy is present where impact damage is caused to the surface during the disintegration of the cluster and the subsequent chemical reaction. For most surface materials, the damage threshold lies in the range of 20 to 50 electron volts per unit.

The mass separator 28 removes ions and clusters that are smaller than the desired size range, by any operable approach. The mass separator may separate ions and clusters of a size smaller than the desired size by electrostatic or magnetic techniques, with electrostatic being preferred. If desired, clusters larger than the desired size can then be separated from the remaining spectrum with a second stage of separation, so that only clusters of the desired size range remain in the cluster beam.

The cluster beam 18, containing primarily singly ionized clusters of the selected size range, is then accelerated toward the substrate 12 by an electrostatic accelerator 30, wherein a first apertured electrode 32 is maintained at a potential less negative than a second apertured electrode 34. The ionized cluster beam 18 passes through the apertures of the electrodes 32 and 34, and are accelerated by the potential difference. The second apertured electrode 34 is typically about 1000 to 10,000 volts more negative than the first apertured electrode 32, which is permitted to float at the same voltage as the ionizer 22. When a singly charged cluster of 1000 atoms passes through the electrodes 32 and 34 maintained at a voltage difference of 1000 volts, an energy of 1000 electron volts is imparted to the clusters of the beam. This high energy and high mass of the cluster permit the cluster to penetrate to the surface 14 of the substrate 12. Upon impact the cluster disintegrates, leaving each unit of the cluster with the comparatively small energy of 1 to 10 electron volts. The small energy per unit does not permit the unit to penetrate the surface 14, or otherwise damage the surface and structure thereon. On the other hand, energies per unit on the order of 1 to 10 electron volts aid in promoting a uniform surface structure of the film.

The energized clusters then enter a focusing and deflection electrode 36, which permits the beam 18 to be scanned or rastered from side to side, so that a pattern can be formed on the surface 14 in a desired shape. If the surface 14 is to be generally exposed, then the electrode 36 need not be used.

In the apparatus 10, an optional reactant input port 38 is provided to introduce a second reactant to the surface 14, for those applications where one reactant is provided in the cluster beam 18 and another is provided by a second external source. In this embodiment, a second reactant is provided in an unclustered form.

A second reactant can also be provided in a clustered form, so that there are two cluster beams 18 and 18' directed at the surface 14 simultaneously. This approach is illustrated in FIG. 2, wherein two apparatus 10 are provided in a single vacuum chamber 16.

Figure 2:
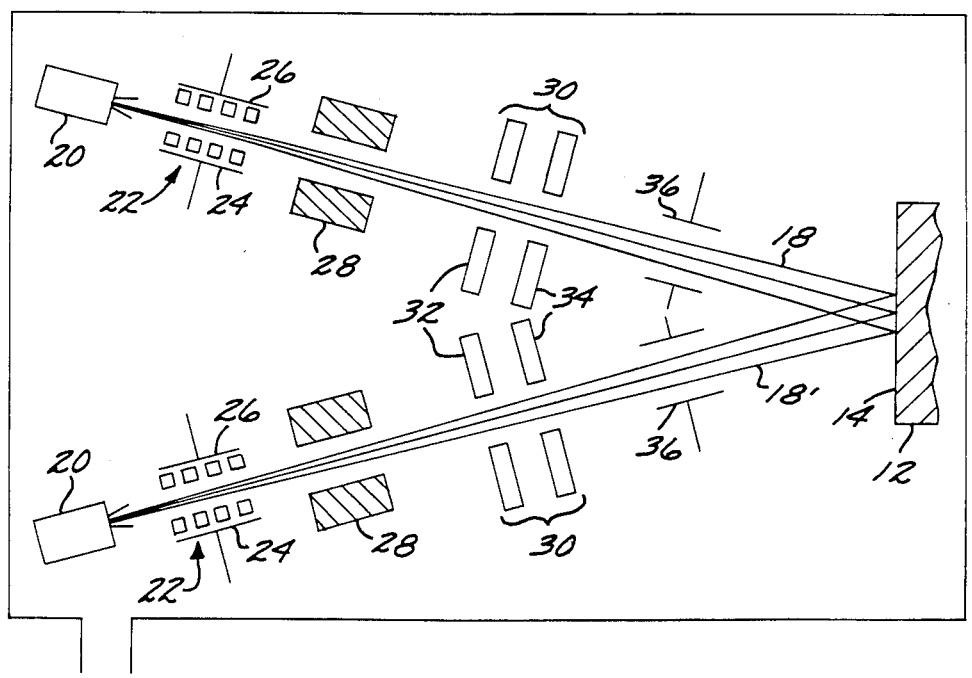
FIG. 2 is a schematic illustration of a cluster beam deposition apparatus for producing two cluster beams.
Figure 3:
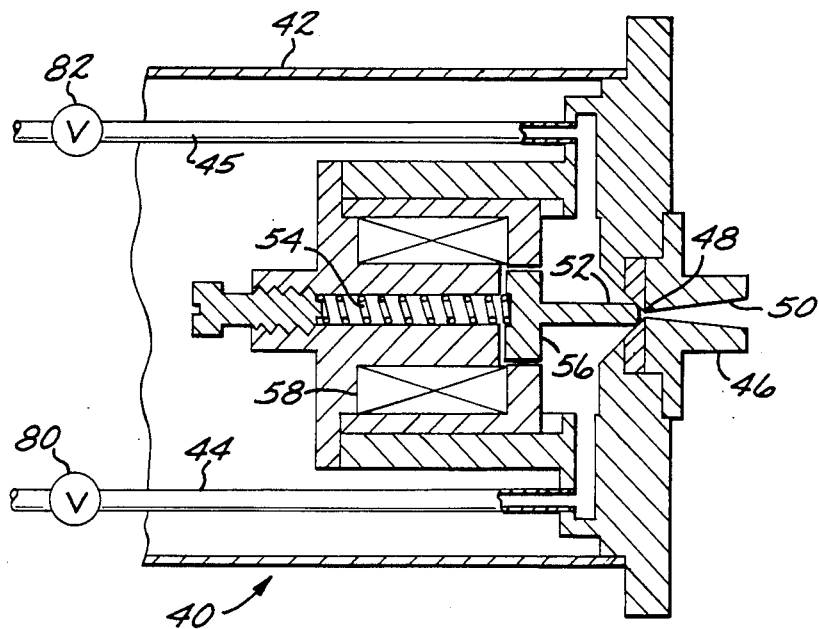
FIG. 3 is a side sectional view of a cluster source.

In the apparatus 10 of FIG. 1 or FIG. 2, the clusters are produced with an appropriate type of source. The preferred pulsed source 40 is illustrated in FIG. 3. The pulsed cluster source 40 includes a hollow body 42 which is pressurized by a gas line 44 that supplies the volatile material to be formed into clusters. A valve 80 controls the flow of gas to the gas line 44. An optional second gas line 45 can supply a second gas to the hollow body 42, and a valve 82 controls the flow of the second gas to the second gas line 45. The source 40 may be operated with only a single type of gas, or with a mixture of gases. The second gas, where used, can be an inert carrier gas such as argon that is introduced either simultaneously or in a programmed manner into the body 42. The second gas can also be a second reactive gas, such that the clusters in the cluster beam 18 include both types of units within a single cluster.

The gas is ejected through a supersonic nozzle 46, typically having a diameter of a narrow throat 48 of about 0.020 inches. The maximum exit diameter of an expansion section 50, through which the gas expands after leaving the throat 48, is larger than that of the throat 48, and is typically about one-quarter of an inch. The ejected gas expands through the supersonic nozzle 46 and groups of the units containing the reactive species condense to form clusters. As the gas expands, it cools and becomes supersaturated, leading to homogeneous nucleation of small clusters in the gas stream. Nucleation can also occur at the interior walls of the supersonic nozzle 46 of the pulsed source 40 by heterogeneous nucleation. As noted earlier, the source 40 produces unclustered units containing the reactive species, small clusters, clusters of the desired sizes, and large clusters. The clusters of the desired sizes are selected by the mass separator 28.

The cluster source 40 can be made to eject the clusters in a pulsing or discontinuous manner by providing a valve plunger 52 that closes the supersonic nozzle 46, at a location just upstream of the throat 48. The valve plunger 52 is held normally closed by a coil spring 54 reacting against the stem 56 of the valve plunger 52. The valve plunger 52 is then moved to the open position by an electromagnetic valve actuator 58. The valve actuator 58 creates a magnetic field when an electrical current is applied, and the magnetic field causes the stem 56 to move within the field.

With this mechanical structure, the valve plunger 52 can be made to open and close rapidly, so that bursts or pulses of gas are emitted through the supersonic nozzle 46. The duty cycle, or periods in which gas is passed out of the cluster source 40 and then not passed, is selected and controlled in accordance with the number of clusters to be delivered to the surface 14 in the cluster beam 18. A typical duty cycle might be 2 milliseconds on, 98 milliseconds off, thereby producing a discontinuous beam. Such an alternating duty cycle might be used to advantageously influence a reaction, or to reduce the gas loading on the pumping system, where the pumping system is relatively small or where extremely high concentrations of clusters are required in each burst of gas. Where a large volume pumping system is available, an alternating duty cycle may be unnecessary.

Figure 4:
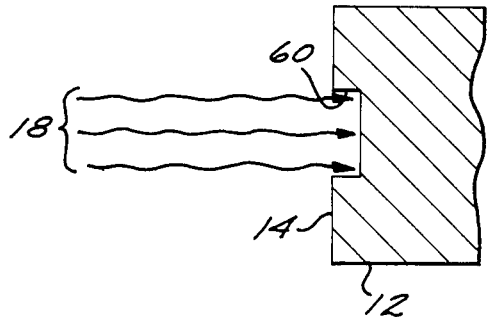
FIG. 4 is a side sectional view of a substrate and its surface, illustrating an energized etching reaction.

One preferred application of the present invention is schematically illustrated in FIG. 4, which depicts etching of the surface 14 by the cluster beam 18. The cluster beam 18 is well collimated, and etches a well defined channel 60 downwardly into the substrate 12. In this type of application, the clusters are formed of structural units that include a reactant that reacts with the material of the substrate 12 to form a volatile reaction product that leaves the surface 14. As an example, if the substrate 12 is silicon, a channel 60 may be etched into the surface 14 by forming clusters from units including a species containing a halogen such as $CCl_4$, $CF_4$, or $NF_3$. Upon impacting the surface, the energized clusters disintegrate and the halogen reacts with the silicon to produce a volatile reaction product. This reaction is confined to the area where the collimated cluster beam 18 meets the surface 14, and effectively removes the substrate material directly under the pattern where the beam impinges upon the surface.

Figure 5:
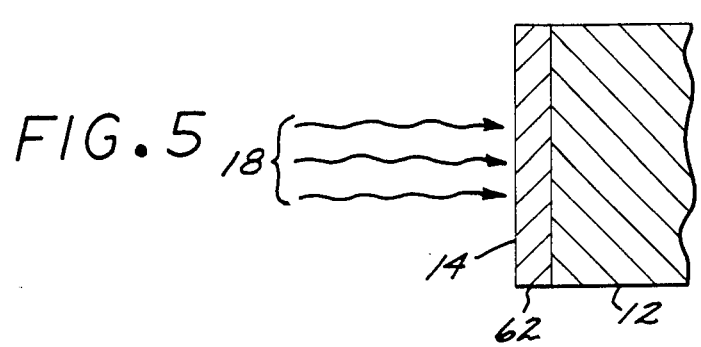
FIG. 5 is a side sectional view of a substrate and its surface, illustrating an energized film deposition reaction.

Another preferred embodiment of the invention is illustrated in FIG. 5, wherein a reactant supplied in the units of the cluster beam 18 reacts with the material making up the substrate 12 to form a reaction product film 62 on the surface of the substrate 12. The film 62 continues to grow in thickness until the substrate reactant and the reactant from the cluster beam can no longer diffuse through the film 62 to reach each other to form more reaction product in the film 62. The growth of the film 62 is thus self limiting. An example of growth of this type of film 62 occurs when the substrate 12 is silicon, and the cluster beam 18 contains units having nitrogen or oxygen, so that in the energized reaction a silicon nitride or silicon oxide film 62 is formed.

FIG. 5 also can be used to illustrate another preferred embodiment. In the alternative approach, a film 62 is formed by the decomposition of units supplied in the cluster beam 18, forming a reaction product that remains on the surface 14 as the film. This type of film can be made indefinitely thick, as long as the reactant species is supplied in the cluster beam. An example of this type of reaction is the formation of a tungsten film on a surface by directing clusters of $W(CO)_6$ against the surface. The clusters disintegrate, and the $W(CO)_6$ molecules decompose in the energized reaction to deposit the tungsten reaction product onto the surface. Carbon monoxide, the volatile reaction product, leaves the surface and is pumped away through the vacuum system.

Figure 6:
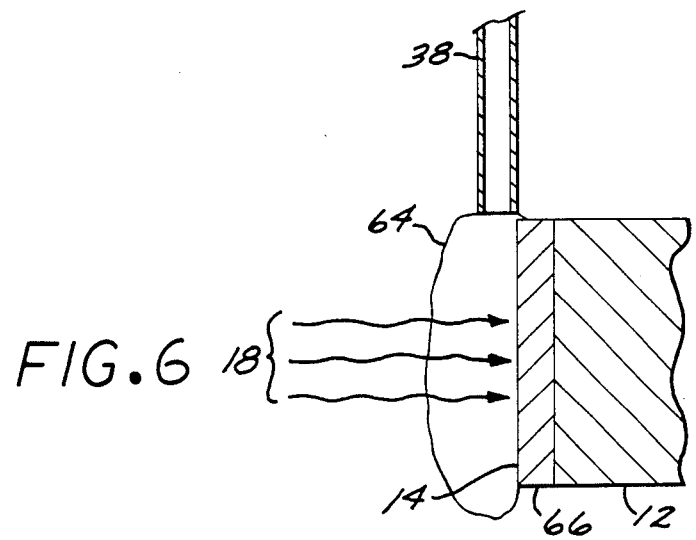
FIG. 6 is a side sectional view of a substrate and its surface, illustrating an energized film deposition reaction with a second externally introduced reactant.

Another preferred embodiment of the invention is illustrated in FIG. 6, wherein one reactant is supplied in the units of the cluster beam 18, and another reactant is supplied to the region above the surface 14 from another external source, here the input port 38. The second supplied reactant forms a reactant cloud 64 above the surface 14. The reactant in the reactant cloud reacts with the energized reactant species on the surface 14, which is deposited and energized through the action of the cluster beam 18. Solid reaction products remain on the surface to form a film 66, while volatile reaction products leave the surface and are pumped away. An example of this type of reaction is the supplying of $AsH_3$ energized reactant in clusters of the cluster beam, and the supplying of tetramethylgallium through the port 38. The two reactants react to produce gallium arsenide reaction product in the film 66, and hydrogen and methane volatile reaction products which leave the surface.

Figure 7:
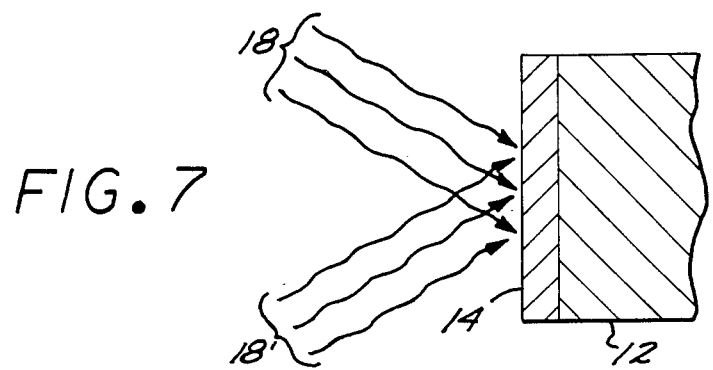
FIG. 7 is a side sectional view of a substrate and its surface, illustrating an energized film deposition reaction with two cluster beams supplying reactants and energy.

Yet another preferred embodiment is illustrated in FIG. 7, wherein the apparatus depicted in FIG. 2 is used to direct two energized reactants against the surface 14. The two reactants are supplied in two separate cluster beams 18 and 18′, produced by two separate cluster sources and beam conditioning systems. Again, a solid reaction product remains on the surface 14 to produce a film 68, and volatile reaction products leave the surface and are pumped away. An example of such a dual energized reaction is the formation of silicon carbide by the simultaneous injection of clusters of the two reactive gases silane and methane (or propane).

It will now be understood that the approach of the present invention provides a new process for inducing energized chemical reactions at surfaces, by supplying at least one of the reactants as a cluster in a cluster beam. When the clusters disintegrate at the surface, both the reactant in the beam and the energy of the beam are delivered to the surface. Energy transfer to the reactant is assured, and there is no need to be concerned with coupling of an external energy source to the reactants. The substrate can be appropriately cooled from its underside. The energized reactant then enters into the chemical reaction at the surface.

Although a particular embodiment of the invention has been described in detail for purposes of illustration, various modifications may be made without departing from the spirit and scope of the invention. Accordingly, the invention is not to be limited except as by the appended claims.

What is claimed is:

1. A process for accomplishing externally energized chemical reactions at a surface, comprising the steps of:
   forming clusters of a volatile reactant species containing from 2 to about 10,000 units, each unit containing a reactant species;
   ionizing the clusters;
   accelerating the clusters toward the surface; and
   impacting the clusters upon the surface, so that the clusters disintegrate and provide a reactant and energy to the chemical reaction at the surface.

2. The process of claim 1, wherein each unit is a single atom.

3. The process of claim 1, wherein each unit is a molecule.

4. The process of claim 1, wherein all reactant species are contained in a unit of the clusters.

5. The process of claim 1, wherein at least one reactant is contained in a unit of the clusters, and at least one reactant is present on the surface.

6. The process of claim 1, wherein at least one reactant is contained in a unit of the clusters, and at least one reactant is supplied to the surface from another source external to the surface.

7. The process of claim 1, wherein the surface is made of a semiconductor material.

8. The process of claim 1, wherein the clusters are impacted upon the surface intermittently.

9. A process for etching a surface, comprising the steps of:
   forming clusters of units of a volatile reactant etchant species, each cluster containing from 2 to about 10,000 units of the reactant species;
   ionizing the clusters;
   accelerating the clusters toward the surface; and
   impacting the clusters upon the surface, so that the clusters disintegrate and provide the etchant species and energy to the etching reaction at the surface.

10. The process of claim 9, wherein each unit is a gas molecule.

11. The process of claim 9, wherein the etchant species is a molecule containing a halogen.

12. A process for accomplishing externally energized chemical reactions at a surface comprising the steps of:
   forming clusters of a volatile reactant species containing from 2 to about 10,000 units by exhausting said volatile species through a supersonic nozzle;
   ionizing the clusters outside the nozzle by electron or photon impact;
   accelerating the clusters by electrostatic fields towards the surface; and
   impacting the clusters upon the surface so that the clusters disintegrate and provide a reactant and energy to the chemical reaction at the surface.

13. A process for accomplishing externally energized chemical reactions at a surface, comprising the steps of:
   forming first clusters containing from 2 to about 10,000 units of a volatile reactant species, each unit containing a first reactant species;
   ionizing the first clusters;
   accelerating the first clusters toward the surface;
   impacting the first clusters upon the surface, so that the first clusters disintegrate and provide the first reactant and energy to the chemical reaction at the surface;
   forming second clusters containing from 2 to about 10,000 units, each unit containing a second reactant species;
   ionizing the second clusters;
   accelerating the second clusters toward the surface; and
   impacting the second clusters upon the surface, so that the second clusters disintegrate and provide the second reactant and energy to the chemical reaction at the surface.

14. The process of claim 13, wherein the steps of impacting the first clusters and impacting the second clusters occur substantially simultaneously.

15. A process for producing a reacted film upon a surface, comprising the steps of:
   forming clusters containing units of a volatile reactant species to be deposited in a film, each cluster containing from 2 to about 10,000 units of the species;
   ionizing the clusters;
   accelerating the clusters toward the surface; and
   impacting the clusters upon the surface, so that the clusters disintegrate and provide the reactant species and energy to the deposition reaction at the surface, the film that is produced being the result of a chemical reaction involving the species provided in the clusters.

16. The process of claim 15, wherein the chemical reaction is the decomposition of the units of the clusters.

17. The process of claim 15, wherein the chemical reaction is the reaction of the reactant species in the clusters with another species on the surface.

18. The process of claim 15, wherein the chemical reaction is the reaction of the reactant species in the clusters with another species provided from another source external to the surface.

* * * * *